United States Patent
Maa et al.

(10) Patent No.: US 8,404,302 B2
(45) Date of Patent: Mar. 26, 2013

(54) SOLUTION PROCESS FOR FABRICATING A TEXTURED TRANSPARENT CONDUCTIVE OXIDE (TCO)

(75) Inventors: Jer-shen Maa, Vancouver, WA (US); Gregory S. Herman, Camas, WA (US); Apostolos T. Voutsas, Portland, OR (US)

(73) Assignee: Sharp Laboratories of America, Inc., Camas, WA (US)

( * ) Notice: Subject to any disclaimer, the term of this patent is extended or adjusted under 35 U.S.C. 154(b) by 316 days.

(21) Appl. No.: 12/836,300

(22) Filed: Jul. 14, 2010

(65) Prior Publication Data
US 2012/0015147 A1    Jan. 19, 2012

(51) Int. Cl.
    B05D 3/02    (2006.01)
    B05D 5/06    (2006.01)
    B05D 5/12    (2006.01)
    H05H 1/00    (2006.01)

(52) U.S. Cl. .... 427/162; 427/74; 427/126.3; 427/383.5; 427/535; 427/539

(58) Field of Classification Search ............... 427/126.3, 427/535, 539, 162, 74
See application file for complete search history.

(56) References Cited

U.S. PATENT DOCUMENTS

| | | | | |
|---|---|---|---|---|
| 5,080,725 A | * | 1/1992 | Green et al. | 136/256 |
| 5,296,045 A | * | 3/1994 | Banerjee et al. | 136/249 |
| 6,072,117 A | * | 6/2000 | Matsuyama et al. | 136/256 |
| 6,787,692 B2 | | 9/2004 | Wada et al. | |
| 7,582,515 B2 | * | 9/2009 | Choi et al. | 438/141 |
| 8,120,027 B2 | * | 2/2012 | Forbes | 257/53 |
| 8,212,250 B2 | * | 7/2012 | Forbes | 257/53 |
| 2008/0223436 A1 | * | 9/2008 | den Boer et al. | 136/256 |
| 2010/0200411 A1 | * | 8/2010 | Liu et al. | 205/96 |
| 2011/0290314 A1 | * | 12/2011 | Kobyakov et al. | 136/256 |

FOREIGN PATENT DOCUMENTS

JP     2006-049107     *    2/2006

OTHER PUBLICATIONS

Muller, J et ai, "Large area sputtered ZnO films as substrates for highly efficient thin-film solar modules", FVS workshop 2002, p. 155, FVEE (Forschungs Verbund Erneuerhare.

Lee, D.-H,, et al, "Functional porous tin oxide thin films fabricated by inkjet printing process", Electrochemical and Solid-State Letters, 10,2007,51.

Chang, Y.-J., et ai, High-performance, spin-coated zinc tin oxide thin-film transistors, Electrochemical and Solid-State Letters 10, 2007, 135.

(Continued)

*Primary Examiner* — Brian K Talbot
(74) *Attorney, Agent, or Firm* — Law Office of Gerald Maliszewski; Gerald Maliszewski

(57) ABSTRACT

A solution process is provided for forming a textured transparent conductive oxide (TCO) film. The process provides a substrate, and forms a first layer on the substrate of metal oxide nanoparticles such as ZnO, $In_2O_3$, or $SnO_2$. The metal oxide nanoparticles have a faceted structure with an average size greater than 100 nanometers (nm). Voids between the metal oxide nanoparticles have a size about equal to the size of the metal oxide nanoparticles. Then, a second layer is formed overlaying the first layer, filling the voids between the nanoparticles of the first layer, and completely covering the substrate. The result is a continuous TCO film having an average surface roughness that is created by the combination of first and second layers.

11 Claims, 2 Drawing Sheets

OTHER PUBLICATIONS

Lee, Doo-Hyoung et ai, "A general route to printable high-mobility transparent amorphous oxide semiconductors", Advanced Materials, 19, 2007, 843.

Tsay, Chien-Yie et ai, "Performance of sol-gel deposited Zn1-xMgxO films used as active channel layer for thin-film transistors", Surface and Coatings Technology, 202, 2007, 1.

Cheng, Hua-Chi et ai, "Transparent ZnO thin film transistor fabricated by sol-gel and chemical bath deposition combination method", Applied PhYSics Letters, 90, 2007, 012113.

Cheng, Hua-Chi et ai, "Thin-film transistors with active layers of zinc oxide (ZnO) fabricated by lowtemperature chemical bath method", Thin Solid Films, 498,2006, 142.

Sun, Baoquan et ai, "Low-temperature sintering of in-plane self-assembled ZnO nanorods for solution-processed high-performance thin film transistors", Journal of Physical Chem.

Sun, Baoquan et ai, "Surface tension and fluid flow driven self-assembly of ordered ZnO nanorod films for high-performance field effect transistors", Journal of the American C.

Sun, Baoquan et ai, "Solution-processed zinc oxide field-effect transistors based on self-assembly of colloidal nanorods", Nano Letters, 6, 2005, 2408.

Redinger David, "High-performance chemical-bath-deposited zinc oxide thin-film transistors", IEEE Transactions on Electron Devices, 54, 2007,1301.

Bakhishev, Teymur et ai, "Solution-processed ZnO nanowire network thin film transistors for transparent electronics", Materials Research Society Symposium Proceedings, 905E.

Ohya, Yutaka et ai, "Fabrication of zinc oxide transparent thin-film transistor with Zr02 insulating layer by sol-gel method", Japanese Journal of Applied Physics, Part 1: Reg.

Ohya, Y., "Thin film transistor of ZnO fabricated by chemical solution deposition", Jpn. J. Appl. Phys., 40, 2001, 297.

Lee, Sui et ai, "Fabrication of a solution-processed thin-film transistor using zinc oxide nanoparticies and zinc acetate", Superlattices and Microstructures, 42, 2007, 361.

Ong, Beng S. et ai, "Stable, solution-processed, high-mobility ZnO thin-film transistors", Journal of the American Chemical SOCiety, 129,2007,2750.

Li, Chensha et ai, "ZnO fieid-effect transistors prepared by aqueous solution-growth ZnO crystal thin film", Journal of Applied Physics, 102,2007,076101.

Lee, Jen Hao, "Chemical solution deposition of Zn1-xZrxO thin films as active channel layers of thinfilm transistors", Electrochemical and Solid-State Letters, 9,2006, G117.

Choi, Chaun GI et ai, "Solution-processed indium-zinc oxide transparent thin-film transistors", Electrochemical and Solid-State Letters, 11,2008, H7.

Norris, B.J. et ai, "Spin-coated zinc oxide transparent transistors", Journal of Physics D: Applied Physics, 36, 2003, L 105.

Meyers, S., et ai. "Aqueous inorganic inks for low-temperature fabrication of ZnO TFTs", J. Amer, Chem, Soc., 130,2008, 17603.

Jeong, S., "Solution-processed zinc tin oxide semiconductor for thin-film transistors", J. Phys. Chem. C, 112,2008,11082.

Koo, C., et ai, "Sol-gel derived Ga—In—Zn—O semiconductor layers for solution-processed thin-film transistors", J. Korean Phys. Soc., 53, 2008, 218.

Levy, D., et ai, "Solution-processed zinc oxide thin-film transistors", SID 07 Digest, 2007, 230.

Pal, B. et ai, "Solution-deposited zinc oxide and zinc oxide/pentacene bilayer transistors: high mobility n-channel, ambipolar, and nonvolatile devices", Adv. Fund. Mater., 1.

Park, W., "Investigation on doping dependency of solution-processes Ga-doped ZnO thin film transistor", Appl. Phys. Lett., 93, 2008, 083508.

Dai, Z. et ai. "A novel tetragonal pyramid-shaped porous ZnO nanostructure and its application in the biosensing of horseradish peroxidase", J. Mater, Chem., 18,2008, 1919.

Choi, S., et ai, "Large-scale synthesis of hexagonal pyramid-shaped ZnO nanocrystals from thermolysis on Zn-oleate complex", J. Physical Chemistry, 13, 109,2005, 14792.

Ren, X, et ai, "Large-scale synthesis of hexagonal cone-shaped ZnO nanoparticles with a simple route and their application to photocatalytic degradation". Mater. Res. Bulletin.

Zheng, J., et ai. "Shape-controlled fabrication of porous ZnO architectures and their photocatalytic properties", J. Solid State Chem., 182,2009, 115.

Ge, M. et ai, "Nanostructured ZnO: from monodisperse nanoparticles to nanorods", J. Crystal Growth, 305, 2007, 162.

Muller, J., et ai, "Large area sputtered ZnO films as substrates for highly efficient thin-film solar modules", FVS workshop 2002, p. 155, FVEE (Forschungs Verbund Erneuerbare.

Zhao, Z., et ai, "Transparent conducting ZnO:Al films via CCVD for amorphous silicon solar cells", 29th IEEE PVSC, New Orleans, May 20-24, 2002, poster 4P2.11.

Deschanvres, J., et ai, "Deposition conditions for the growth of texture ZnO thin films by aerosol CVD process", J. de physique IV, 3,485, 1993.

Senoussaoui, N., et ai. "Optical properties of microcrystalline thin film solar cells", Rev. Energ. Ren., 3. 2000,49.

Kluth, O. et ai, "Sputtered zinc oxide films for silicon thin film solar cells: material properties and surface texture", 17th European Photovoltaic Solar Energy Conference, O.

Rech, B., et ai, "Highly efficient silicon thin film solar cells with advanced light trapping", 3rd World Conference on Photovoltaic Energy Conversion WCPEC-3, May 2003, Osaka.

Lee, J. et ai, "Operation properties of I,lc-Si:H pin and a-Si:H/I.lc-Si:H tandem solar cells", Asian J. Energy Environ., 5, 2004, 99.

Yoo, J., "Properties of textured ZnO:Al films prepared by RF magnetron sputtering for thin film solar cells", J. Korean physical Soc., 47, 2005, S576.

Gao, X., et ai, "Influence of surface texture by NH4Cl aqueous solution on the electrical and optical properties of Al-doped zinc oxide films", Brazilian J. Physics, 38, 2008.

Han, S.-Y., et ai, "Chemical nanoparticle deposition of transparent ZnO thin films", Electrochemical and Solid-State Letters, 10, 2007, K1.

* cited by examiner

SOLUTION PROCESS FOR FABRICATING A TEXTURED TRANSPARENT CONDUCTIVE OXIDE (TCO)

BACKGROUND OF THE INVENTION

1. Field of the Invention

This invention generally relates to a material structure with a transparent conductive oxide (TCO) layer and, more particularly, to a process for forming a textured TCO layer to increase light confinement, suitable for solar cells.

2. Description of the Related Art

Transparent conducting films (TCFs) for photovoltaic applications are fabricated from both inorganic and organic materials. Inorganic films typically are made up of a layer of TCO (transparent conducting oxide), generally in the form of indium tin oxide (ITO), fluorine doped tin oxide (FTO), or doped zinc oxide (ZnO). Transparent conducting films act both as a window for light to pass through to the active material beneath (where carrier generation occurs) and as an ohmic contact for carrier transport out of the photovoltaic. Transparent materials possess bandgaps with energies corresponding to wavelengths which are shorter than the visible range (380 nanometers (nm) to 750 nm). As such, photons with energies below the bandgap are not collected by these materials and visible light passes through. However, applications such as photovoltaics may require an even broader bandgap to avoid unwanted absorption of the solar spectra.

Transparent conductive oxides (TCO) are metal oxides, often doped, that may also be used in flat panel displays, as well as photovoltaic devices. Most films are fabricated with polycrystalline or amorphous microstructures. On average, these applications use electrode materials that have greater than 80% transmittance of incident light as well as high conductivities for efficient carrier transport. The transmittance of these films, just as in any transparent material, is limited by light scattering at defects and grain boundaries. In general, TCOs for use as thin-film electrodes in solar cells should have a minimum carrier concentration on the order of $10^{20}$ cm$^{-3}$ for low resistivity and a bandgap less than 380 nanometers to avoid absorption of light over most of the solar spectra. Mobility in these films is limited by ionized impurity scattering and is on the order of 40 cm$^2$/(V·s). Conventional transparent conducting oxides used in industry are primarily n-type conductors, meaning their primary conduction is from the flow of electrons. Suitable p-type transparent conducting oxides are possible.

To date, the industry standard in TCO is ITO. This material boasts a low resistivity of ~$10^{-4}$ Ω·cm and a transmittance of greater than 80%. However, ITO has the drawback of being expensive. Indium, the film's primary metal, is rare. For this reason, doped binary compounds such as aluminum-doped zinc-oxide (AZO) and indium-doped cadmium-oxide have been proposed as alternative materials. AZO is composed of aluminum and zinc, two common and inexpensive materials, while indium-doped cadmium oxide only uses indium in low concentrations.

Binary compounds of metal oxides without any intentional impurity doping have also been developed for use as TCOs. These systems are typically n-type with a carrier concentration on the order of $10^{20}$ cm$^{-3}$, provided by interstitial metal ions and oxygen vacancies which both act as donors. However, these simple TCOs have not found practical use due to their electrical properties' high temperature and oxygen partial pressure dependence.

Doped metal oxides for use as transparent conducting layers in photovoltaic devices are typically grown on a glass substrate. This glass substrate, apart from providing a support on which the oxide can grow, has the additional benefit of blocking most infrared wavelengths greater than 2 μm for most silicates, and converting it to heat in the glass layer. This in turn helps maintain a low temperature of the active region of the solar cell, which degrades in performance as it heats up. TCO films can be deposited on a substrate through various deposition methods, including metal organic chemical vapor deposition (MOCVD), metal organic molecular beam deposition (MOMBD), spray pyrolysis, and pulsed laser deposition (PLD). However, conventional fabrication techniques typically involve magnetron sputtering of the film. The sputtering process is very inefficient, with only 30% of the material actually being deposited on the substrate. In the case of ITO this inefficiency is a significant drawback. Growth typically is performed in a reducing environment to encourage oxygen vacancy formation within the film, which contributes to the carrier concentration (if n-type).

Charge carriers in these oxides arise from three fundamental sources: interstitial metal ion impurities, oxygen vacancies, and doping ions. The first two sources always act as electron donors. Indeed some TCOs are fabricated solely using these two intrinsic sources as carrier generators. When an oxygen vacancy is present in the lattice it acts as a doubly-charged electron donor. In ITO for example, each oxygen vacancy causes the neighboring In$^{3+}$ ion 5s orbitals to be stabilized from the 5s conduction band by the missing bonds to the oxygen ion, while two electrons are trapped at the site due to charge neutrality effects. This stabilization of the 5s orbitals causes a formation of a donor level for the oxygen ion, determined to be 0.03 eV below the conduction band. Thus, these defects act as shallow donors to the bulk crystal. To enhance their electrical properties, ITO films and other transparent conducting oxides are grown in reducing environments, which encourages oxygen vacancy formation.

Dopant ionization within the oxide occurs in the same way as in other semiconductor crystals. Shallow donors near the conduction band (n-type) allow electrons to be thermally excited into the conduction band, while acceptors near the valence band (p-type) allow electrons to jump from the valence band to the acceptor level, populating the valence band with holes. Carrier scattering in these oxides arises primarily from ionized impurity scattering. Charged impurity ions and point defects have scattering cross-sections that are much greater than their neutral counterparts. Increasing the scattering decreases the mean-free path of the carriers in the oxide, which leads to poor device performance and a high resistivity. An insulator such as an oxide can experience a composition-induced transition to a metallic state given a minimum doping concentration, permitting carrier flow.

Two other TCOs that are often used are ZnO/Al and In$_2$O$_3$/Sn. In materials science, ZnO is often called a II-VI semiconductor because zinc and oxygen belong to the 2nd and 6th groups of the periodic table, respectively. This semiconductor has several favorable properties: good transparency, high electron mobility, wide bandgap, strong room-temperature luminescence. ZnO has a relatively large direct band gap of ~3.3 eV at room temperature. The advantages associated with a large band gap include higher breakdown voltages, the ability to sustain large electric fields, lower electronic noise, and high-temperature and high-power operation.

Most ZnO has n-type character, even in the absence of intentional doping. Nonstoichiometry is typically the origin of n-type character. Controllable n-type doping is easily achieved by substituting Zn with group-III elements such as Al, Ga, In, or by substituting oxygen with group-VII elements chlorine or iodine.

In thin-film solar cells, light confinement techniques increase the path traveled by the incoming light, therefore, increasing the probability of photogeneration per incident photon. Light confinement is different from anti-reflection coating, which increases the fraction of photons admitted to the cell. Light confinement, or light trapping, can be achieved by texturing the rear surface, such that the reflected light rays from the rear surface reach the front surface at a lower angle. The rays are unable to escape from the cell and are reflected back in multiple paths between the front and rear surfaces. Light trapping is an essential technique for realizing high efficiency, high stability, and low cost, which are all required for the practical application of thin-film solar cells.

In the past decade the use of transparent conductive oxides as front and/or back contact material in thin-film solar cells has been studied in detail. In recent years ZnO and doped ZnO films have emerged as one of the most interesting materials. Various methods to form ZnO films, and the techniques to etch and control the surface texture, have been explored in great depth. However, most developed techniques still require expensive vacuum equipment, and the process is still complex. Large area ZnO films for high efficient silicon thin-film modules are mostly prepared by high rate sputtering. The cost of production is still high. Chemical vapor deposition of ZnO requires vacuum pumps, high vacuum chamber, and gas flow and pressure control. Although simpler methods of chemical vapor deposition, such as combustion chemical vapor deposition (CCVD) and aerosol chemical vapor deposition (Aerosol CVD) have been reported, more thorough evaluations of the films for high efficient reliable and low cost solar modules are lacking.

Most deposited films show some degree of surface texture. The surface roughness or undulation of ZnO films can be enhanced by adjusting the deposition condition. However, an additional etch step is needed to generate reproducible surface texturing. Many have reported the use of dilute HCl solution to obtain textured ZnO, where the roughness has been found to increase with etch time. The relative high etch rate of HCl solution, even in dilute solution, makes etch control difficult. Aqueous solutions of $NH_4Cl$ have also been tested and found to generate textured surface morphology. Most of the existing methods to form ZnO films involve vacuum process, an additional etch process is added to generate the surface texture. The cost could be greatly reduced if ZnO and doped ZnO films with textured could be generated at the same time by a simple solution process or using printing technology.

In the past few years, studies using solution processes to generate ZnO layer have been reported from several institutes. Most of the reports are focused on the semiconductor behavior of the film, for thin-film transistor (TFT) in display application. In this area, the ZnO films need to meet the need of good mobility, high transistor on/off ratio, and well-controlled threshold voltage. The surface morphology, high conductivity, and optimized optical transmission are not the main concerns, and the control of surface texture is not discussed in these reports.

It would be advantageous if metal oxide films, such as ZnO and doped ZnO films, could be properly textured for light trapping, using inexpensive solution and printing technologies.

SUMMARY OF THE INVENTION

A method is described herein to form ZnO, doped ZnO, and other transparent conductive oxide (TCO) films by a solution process. TCO films made from materials such as zinc tin oxide (TZO), $ZnSnO_3$, tin oxide (e.g., $SnO_2$ and $SnO_2$:F), indium zinc oxide IZO, and indium oxide, to name a few, can be doped with one, or with a combination of dopants from the following list: Al, Ga, Mg, Cd, P, Ti, Mn, Fe, Co, Ni, Cu, Sb, and Nd. This method is different from previous reported works in that a textured structure is formed during the film coating step, which permits light trapping, without the requirement of an additional etch step. In one aspect, ZnO or doped ZnO nanoparticles are deposited with a special surface texture, for example, pyramid-shaped ZnO nanoparticles. In a subsequent step, a material is deposited that forms a continuous ZnO or doped ZnO layer after a mild thermal process.

Accordingly, a solution process is provided for forming a textured transparent conductive oxide film. The process provides a substrate, and forms a first layer on the substrate of metal oxide nanoparticles such as ZnO, $In_2O_3$, or $SnO_2$. The metal oxide nanoparticles have a faceted structure with an average size greater than 100 nanometers (nm). Voids between the metal oxide nanoparticles have a size about equal to the size of the metal oxide nanoparticles. Then, a second layer is formed overlaying the first layer, filling the voids between the nanoparticles of the first layer, completely covering the substrate. The result is a continuous TCO film having an average surface roughness that is created by the combination of first and second layers.

In one aspect, the second layer is formed by depositing a solution of suspended metallic nanoparticles in a solvent, where the metallic nanoparticles are Zn, Sn, or In, and the solvent is an organic or inorganic liquid medium. Then, an annealing is performed to sinter the metal nanoparticles, forming a metal oxide film. In another aspect, the second layer is formed by chemically synthesizing a metal oxide of ZnO, $In_2O_3$, or $SnO_2$, and annealing to densify the second layer.

Additional details of the above-described methods and a TCO structure are provided below.

DETAILED DESCRIPTION

Figure 1:
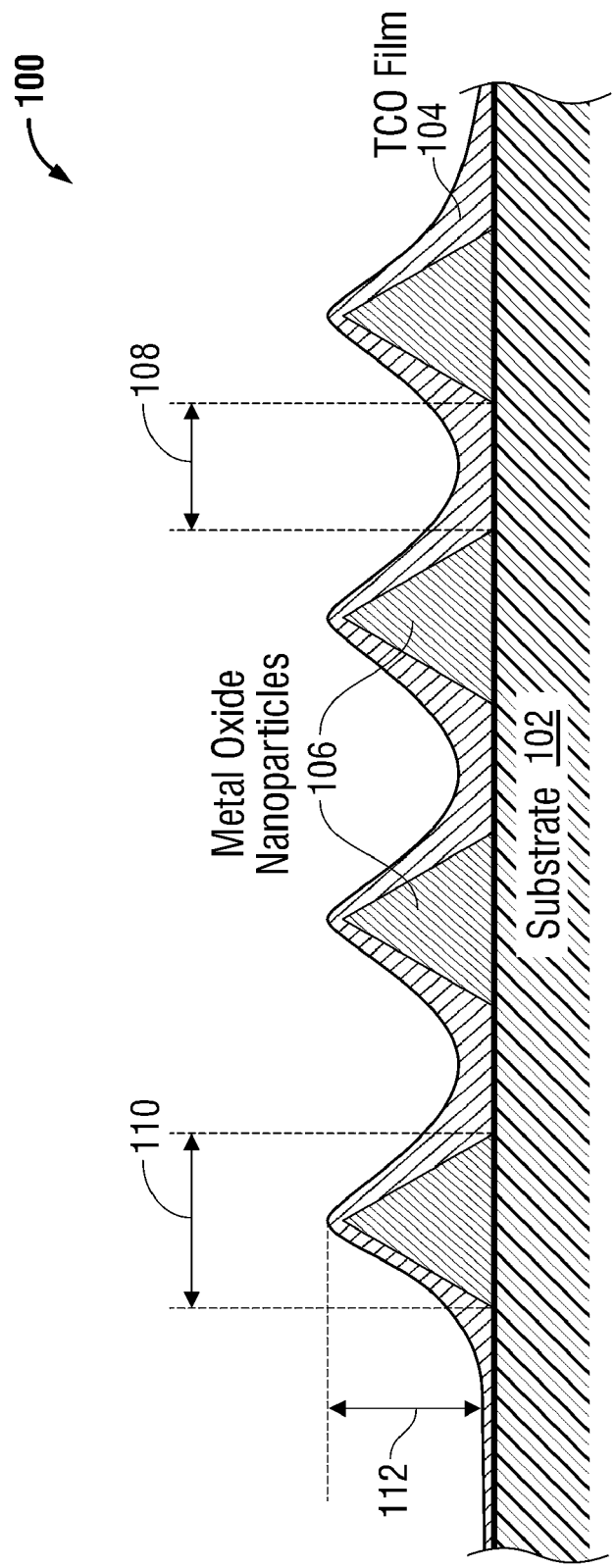
FIG. 1 is a partial cross-sectional view of a transparent conductive oxide (TCO) structure.

FIG. 1 is a partial cross-sectional view of a transparent conductive oxide (TCO) structure. The TCO structure 100 comprises a substrate 102 and a TCO film 104, with metal oxide nanoparticles 106 separated by a distance. 108 about equal to the size 110 (maximum cross-sectional vector) of the metal oxide nanoparticles 106. As shown, the metal oxide nanoparticles 106 have a pyramidal shape. However, other shapes would also be possible. Note: the substrate 102 may be a transparent material such as glass, but the substrate is not limited to any particular type of material.

The TCO structure has an average surface roughness 112 in a range of 100 to 500 nanometers (nm). As defined herein, average surface roughness is defined the average vertical difference between a maximum film height associated with a metal oxide nanoparticle 106 and a local minimum height of the film 104 adjacent the nanoparticles. As can be seen, the TCO film 104 continuously covers the substrate 102 and the metal oxide nanoparticles 106.

In one aspect, the TCO film 104 is a ZnO, $In_2O_3$, or $SnO_2$. Likewise, the metal oxide nanoparticles 106 can be ZnO, $In_2O_3$, or $SnO_2$. Typically, the TCO film 104 is a metal oxide material using the same metal as that selected for the metal oxide nanoparticles 106. For example, if the metal oxide nanoparticles 106 are ZnO, the TCO film 104 would also be ZnO. However, in one aspect, the TCO film may be a metal oxide material using a metal other than that selected for the metal oxide nanoparticles. For example, if the metal oxide nanoparticles 106 are ZnO, the TCO film 104 could be $SnO_2$.

FUNCTIONAL DESCRIPTION

A method to form ZnO, doped ZnO, and other TCO films by solution process is described herein. It is different from previous reported works in that a textured structure is formed, which allows light trapping, with no additional etch step. The method is fundamentally a two-step process. The first constituent contributes to surface texture, and the second constituent forms a continuous film between the first constituent. The result is a continuous transparent conductive oxide with surface texture.

The first constituent is made from ZnO, doped ZnO, or TCO nanoparticles with a distinct texture, such as pyramid-shaped. Once these pyramid-shaped nanoparticles are coated and grouped together on the surface, the facets of the nanoparticles reflect the light rays at a lower angle towards the front surface, thereby causing multiple reflections between the front and the rear surfaces of the film. Special shaped ZnO, doped ZnO, or TCO nanoparticles can be prepared by solution, as is well known in the art. The second constituent serves the purpose of filling the voids at the base of the film between nanoparticles, to form a continuous ZnO, doped ZnO, or TCO film. There are several approaches to form this continuous film.

In one approach, the second constituent is a metal nanoparticles, such as Zn or Zn doped with dopant material. Since the melting point of zinc is 420° C., the melting point and sintering temperature of the Zn nanoparticles is reduced to about 200° C. Therefore, as an example, by mixing Zn nanoparticles with pyramid-shape ZnO nanoparticles, a continuous ZnO film can be formed at low temperature after very mild sintering and oxidation reaction.

The second constituent can also contain nanoparticles of ZnO with sizes smaller than 10 nm. Due to a reduced melting temperature of small-sized nanoparticles, a subsequent annealing at a relatively mild temperature can cause the sintering of these nanoparticles to form a continuous film. It is also possible to add nanoparticles of metallic tin or indium or their alloys into the second constituent.

Another solution-based method uses zinc acetate, zinc chloride, or zinc nitrate for example, to form a continuous ZnO or doped ZnO film. The pyramid-shaped metal oxide nanoparticles are mixed with the solution. For example, ZnO nanoparticles can be mixed with zinc acetate to form a printable ink. The choice of dopant may be from the Group IIIA materials, such as B, Al, Ga, or In. The dopant may be introduced at the same time as when ZnO nanoparticles are formed, and again into the second constituent material.

In another solution-based method, indium chloride, indium isopropoxide, tin chloride, or tin isopropoxide for example, may be used to form a continuous $In_2O_3$, $SnO_2$, or TCO film. Pyramid-shaped nanoparticles are mixed with the solution to form a printable ink, which is both continuous and textured. For example, in a first step a ZnO layer can be applied by spin coating, dip coating, or printing. The ink components contain organic solvents, surfactant, and additives adjusted to match the printing process. In a second step, the ZnO layer is baked at a mild temperature from 100 to 350° C. to expel the organic solvents and initiate the proper sintering and formation of the continuous ZnO film, which connects all the ZnO nanoparticles to form a highly conductive layer. When necessary, a third step exposes the film to a low temperature oxidation ambient, such as oxygen, to facilitate the complete conversion of metallic nanoparticles, such as Zn nanoparticles, to oxide.

As described here, the method to form a continuous ZnO film with surface texture by solution process is relatively easy and very cost effective, as compare to sputtering, chemical vapor deposition, or by electrochemical methods.

Figure 2:
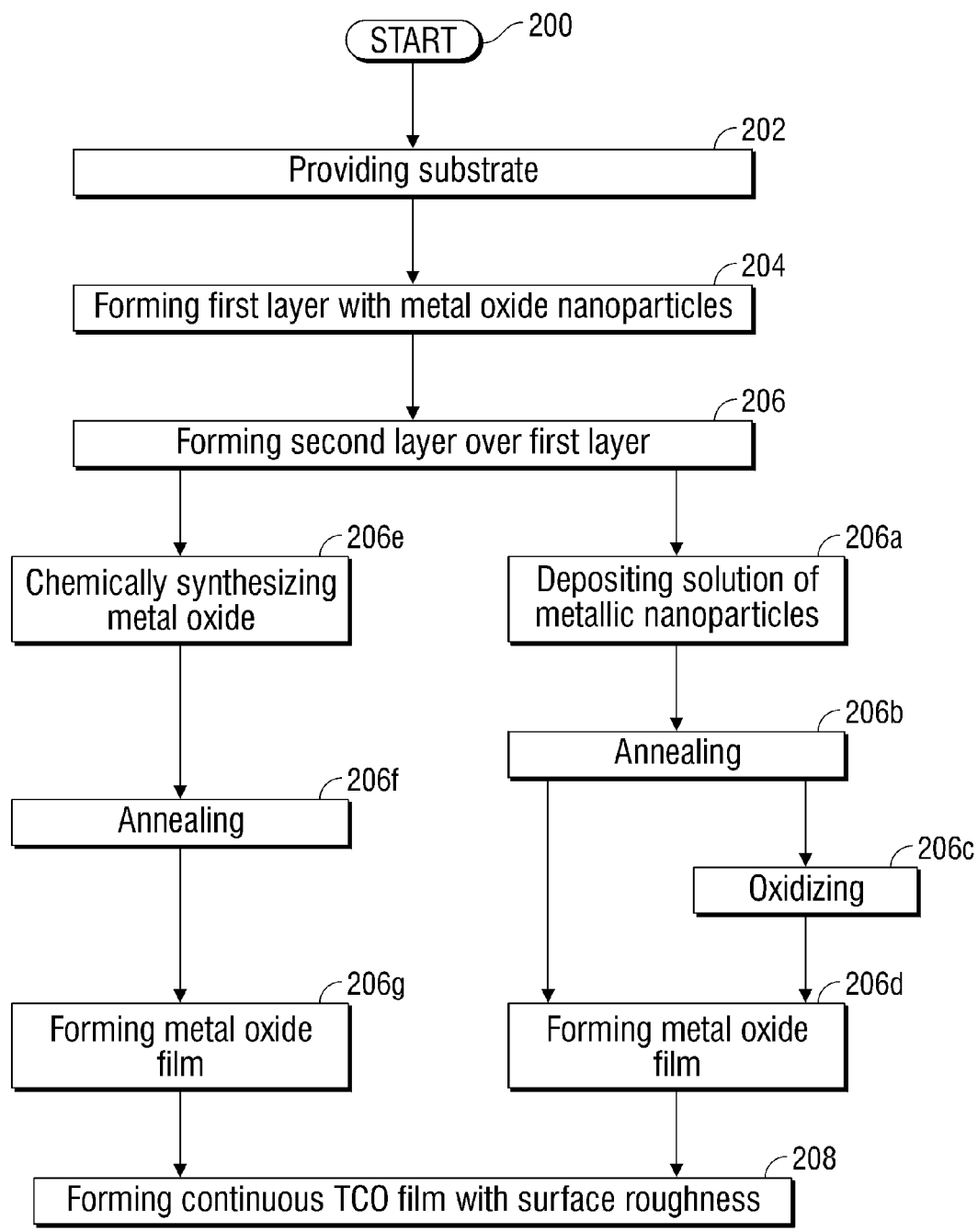
FIG. 2 is a flowchart illustrating a solution process for forming a textured TCO film.

FIG. 2 is a flowchart illustrating a solution process for forming a textured TCO film. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the steps are performed in numerical order. The method starts at Step 200.

Step 202 provides a substrate. Step 204 forms a first layer on the substrate of metal oxide nanoparticles (e.g., ZnO, $In_2O_3$, or $SnO_2$) having a faceted structure with an average size greater than 100 nm, with voids between the metal oxide nanoparticles having a size about equal to the size of the metal oxide nanoparticles. For example, these metal oxide nanoparticles may have a pyramid shape. The first layer may be deposited using a deposition method such as ink-jet printing, offset printing, spin-coating, or print-screening.

Step 206 forms a second layer overlaying the first layer, filling the voids between the nanoparticles of the first layer, and completely covering the substrate and the previously deposited metal oxide nanoparticles. The second layer may be deposited using a deposition method such as ink-jet printing, offset printing, spin-coating, or print-screening. Typically, Step 206 forms a metal oxide using the same metal as that selected for the first layer. Alternately, Step 206 forms a metal oxide using a metal different than that selected for the first layer.

Step 208 forms a continuous TCO film having an average surface roughness that is created by the combination of first and second layers. For example, the average surface roughness may be in the range of 100 to 500 nm.

In one aspect, forming the second layer in Step 206 includes substeps. Step 206a deposits a solution of suspended metallic nanoparticles in a solvent. Typically, the metallic nanoparticles of the second layer have an average size less than about 10 nm. The metallic nanoparticles may be Zn, Sn, or In, and the solvent is may be an organic or inorganic liquid medium. Step 206b anneals to sinter the metal nanoparticles. Typically, the annealing is performed at a temperature insufficient to sinter the metal oxide nanoparticles in the first layer. Step 206d forms a metal oxide. In one aspect, the sintering anneal of Step 206b is conducted in an $O_2$-rich ambient atmosphere. Alternately, subsequent to the sintering anneal, Step 206c performs an oxidizing process step. For example, the oxidizing process step may be accomplished by exposing the second layer to an oxidizing plasma.

In a different aspect, forming the second layer includes alternative substeps. Step 206e chemically synthesizes a metal oxide such as ZnO, $In_2O_3$, or $SnO_2$. "Chemical synthesis" refers to a solution-based method to synthesize a metal oxide film. As an example, in the case of ZnO, chemical synthesis involve the decomposition of a precursor such as zinc acetate to form a continuous ZnO film. Step 206f anneals to densify the second layer. Again, the annealing is performed at a temperature insufficient to sinter the metal oxide nanoparticles in the first layer.

In one aspect, dopant elements such as B, Al, Ga, or In, are added to both the first and second layers, respectively, in Step 204 and 206, or just the second layer in Step 206.

A TCO structure and associated fabrication process have been provided. Particular materials, dimensions, and process steps have been given to illustrate the invention. However, the invention is not limited to just these examples. Other variations and embodiments of the invention will occur to those skilled in the art.

We claim:

1. A solution process for forming a textured transparent conductive oxide (TCO) film, the process comprising:
    providing a substrate;
    forming a first layer on the substrate of metal oxide nanoparticles having a pyramid structure with an average size greater than 100 nanometers (nm), with voids between the metal oxide nanoparticles having a size about equal to the size of the metal oxide nanoparticles;
    forming a second layer overlaying the first layer, filling the voids between the nanoparticles of the first layer, and completely covering the substrate, wherein forming the second layer includes:
        depositing a solution of suspended metallic nanoparticles in a solvent where the metallic nanoparticles are selected from a group consisting of Zn, Sn, and In, and the solvent is selected from a group consisting of organic and inorganic liquid mediums;
    annealing to sinter the metal nanoparticles, at a temperature insufficient to sinter the metal oxide nanoparticles in the first layer;
    forming a metal oxide film; and,
    forming a continuous TCO film having an average surface roughness that is created by the combination of first and second layers.

2. The process of claim 1 wherein the sintering anneal is conducted in an $O_2$-rich ambient atmosphere.

3. The process of claim 1 wherein forming the second layer further includes, subsequent to the sintering anneal, an oxidizing process step.

4. The process of claim 3 wherein the oxidizing process step is accomplished by exposing the second layer to an oxidizing plasma.

5. The process of claim 1 wherein the metallic nanoparticles of the second layer have an average size less than about 10 nm.

6. The process of claim 1 wherein forming the first and second layers includes adding dopant elements selected from a group consisting of B, Al, Ga, and In, to a layer selected from a group consisting of both the first and second layers, and just the second layer.

7. The process of claim 1 wherein forming the continuous TCO film includes creating the average surface roughness in a range of 100 to 500 nm.

8. The process of claim 1 wherein forming the first layer includes using a deposition method selected from a group consisting of ink-jet printing, offset printing, spin-coating, and print-screening.

9. The process of claim 1 wherein forming the second layer includes using a deposition method selected from a group consisting of ink-jet printing, offset printing, spin-coating, and print-screening.

10. The process of claim 1 wherein forming the first layer includes forming the first layer with metal oxide nanoparticles selected from a group consisting of ZnO, $In_2O_3$, and $SnO_2$.

11. The process of claim 10 wherein forming the second layer includes forming a metal oxide in the second layer using the same metal as that selected for the first layer.

* * * * *